(12) United States Patent
Fan et al.

(10) Patent No.: US 11,677,087 B2
(45) Date of Patent: Jun. 13, 2023

(54) METHOD FOR OPTIMIZING POWER DISTRIBUTION OF FUEL CELL VEHICLE

(71) Applicant: HIGER BUS COMPANY LIMITED, Suzhou (CN)

(72) Inventors: Haimei Fan, Suzhou (CN); Wei Zhang, Suzhou (CN); Jinfeng Xiong, Suzhou (CN); Yushuai Shi, Suzhou (CN)

(73) Assignee: HIGER BUS COMPANY LIMITED, Suzhou (CN)

( * ) Notice: Subject to any disclaimer, the term of this patent is extended or adjusted under 35 U.S.C. 154(b) by 0 days.

(21) Appl. No.: 17/624,308

(22) PCT Filed: Oct. 13, 2020

(86) PCT No.: PCT/CN2020/120516
§ 371 (c)(1),
(2) Date: Dec. 31, 2021

(87) PCT Pub. No.: WO2021/043323
PCT Pub. Date: Mar. 11, 2021

(65) Prior Publication Data
US 2022/0359896 A1 Nov. 10, 2022

(30) Foreign Application Priority Data

Sep. 3, 2019 (CN) .......................... 201910825557.1

(51) Int. Cl.
*H01M 8/04858* (2016.01)
*G01R 31/387* (2019.01)
*H01M 8/04537* (2016.01)

(52) U.S. Cl.
CPC ...... *H01M 8/04932* (2013.01); *G01R 31/387* (2019.01); *H01M 8/04611* (2013.01); *H01M 8/04626* (2013.01); *H01M 2250/20* (2013.01)

(58) Field of Classification Search
CPC .......................... H01M 2250/20; B60L 58/40
See application file for complete search history.

(56) References Cited

U.S. PATENT DOCUMENTS

| 2003/0207156 A1 | 11/2003 | Ovshinsky et al. |
| 2007/0284166 A1 | 12/2007 | Maier et al. |
| 2013/0335000 A1* | 12/2013 | Maier ............... H01M 8/04089 320/101 |

FOREIGN PATENT DOCUMENTS

| CN | 202498998 U | 10/2012 |
| CN | 105667330 A | 6/2016 |

(Continued)

OTHER PUBLICATIONS

Wei et al., CN 110271454 A, Espacenet machine translation, 2019 (Year: 2019).*

*Primary Examiner* — Adam A Arciero
(74) *Attorney, Agent, or Firm* — SZDC Law P.C.

(57) ABSTRACT

A rational fuel-cell power following strategy is made according to values such as vehicle fuel-cell power, battery power, and SOC (state of charge) of a lithium-ion battery; in the same time window, effects of different fuel-cell power growth rates on SOC of the lithium-ion battery are tested according to vehicle requirements; and at the same fuel-cell growth rate, effects of different time windows on SOC of the lithium-ion battery are tested according to vehicle requirements; a proper time window and a proper fuel-cell power change rate are found, so that the SOC value of the lithium-ion battery fluctuates within a certain range. The present invention can achieve a good operation mode of power distribution between the fuel cell and the lithium-ion battery, ensuring rational utilization of resources, thereby extending the application range of the lithium-ion battery to the maximum extent.

5 Claims, 5 Drawing Sheets

(56) References Cited

FOREIGN PATENT DOCUMENTS

| CN | 105857219 | A |   | 8/2016  |            |
|----|-----------|---|---|---------|------------|
| CN | 108944900 | A |   | 12/2018 |            |
| CN | 109693578 | A |   | 4/2019  |            |
| CN | 110182071 | A |   | 8/2019  |            |
| CN | 110271454 | A | * | 9/2019  | B60L 53/00 |
| CN | 110588443 | A |   | 12/2019 |            |

* cited by examiner

METHOD FOR OPTIMIZING POWER DISTRIBUTION OF FUEL CELL VEHICLE

This application is the National Stage Application of PCT/CN2020/120516, filed on Oct. 13, 2020, which claims priority to Chinese Patent Application No. 201910825557.1, filed on Sep. 3, 2019, which is incorporated by reference for all purposes as if fully set forth herein.

FIELD OF THE INVENTION

The present invention belongs to the technical field of fuel-cell vehicle management, and specifically relates to a method for optimizing the power distribution of a fuel-cell vehicle.

BACKGROUND OF THE INVENTION

With the pressure of environment and energy as well as the decline of national subsidies for pure electric vehicles, fuel-cell vehicles with absolute zero emission are becoming more and more popular. However, the current fuel-cell vehicles on the market are actually not hydrogen-fuel-cell vehicles in the strict sense, and they all need to be equipped with lithium-ion batteries as an auxiliary power supply. Therefore, the current fuel-cell vehicles on the market can only be regarded as a dual-energy hybrid vehicle. Because the fuel cell changes slowly in its output power and cannot follow the vehicle power requirements to make instantaneous changes, it has a low ability to follow the vehicle power. Since the fuel-cell system cannot meet the instantaneous high current demand of the vehicle, the lithium-ion battery is required as the provider of the remaining energy needed by the vehicle, i.e. $E_{vehicle} - E_{fuel\ cell}$. When the vehicle performs braking feedback, the fuel cell cannot quickly reduce the power, nor can it recover the braking energy; at this time, the energy $E_{vehicle\ braking} + E_{fuel\ cell}$ will be fed back to the lithium-ion battery.

Since there are two energy sources, the power distribution of the energy has to be considered. Limited by the low fuel-cell power change rate, it is necessary to find a proper fuel-cell power change rate and an average power change rate within a suitable time window under the premise of meeting the needs of the vehicle and ensuring the good use of the fuel cell, so as to optimally adapt to the needs of the vehicle under various operating conditions. If the fuel-cell vehicle is equipped with a large-electric-quantity lithium-ion battery, the corresponding SOC (state of charge) fluctuation range of the lithium-ion battery will be small, such that it will be easy to select the most suitable SOC range for the lithium-ion battery, so as to prolong the service life of the lithium-ion battery; however, this will be not conducive to the lightweight and economical efficiency of the vehicle. If the fuel-cell vehicle is equipped with a small-electric-quantity lithium-ion battery, the SOC fluctuation range will be relatively increased, which will have a certain impact on the service life of the lithium-ion battery; however, this can save resource allocation, rationally allocate the vehicle power, and extend the application range of the lithium-ion battery to the maximum extent, which is conducive to the reduction of vehicle price and the rational utilization of resources. For batteries, only the SOC fluctuation range of the batteries with different electric quantities (in kW·h) can be adjusted.

At present, the electric quantities (in kW·h) of the lithium-ion batteries carried by the fuel-cell vehicles are relatively large, some having reached twice the electric quantities (in kW·h) of the lithium-ion batteries on hybrid vehicles; if there is no demand for driving purely with the lithium-ion battery, most of the energy is not used. Therefore, there is an urgent need for a power distribution strategy to ensure rational utilization of resources.

CONTENTS OF THE INVENTION

In view of the above technical problems, the object of the present invention is to provide a method for optimizing the power distribution of a fuel-cell vehicle, which can realize a good operation mode of power distribution between the fuel cell and the lithium-ion battery, so as to ensure the rational utilization of resources.

The present invention adopts the following technical solution:

A method for optimizing the power distribution of the fuel-cell vehicle is provided, comprising the following steps:

S01: selecting a fixed time window, and calculating a required average vehicle power within the time window; decreasing the fuel-cell power according to a fuel-cell power change rate when the fuel-cell power is greater than the average vehicle power, and increasing the fuel-cell power according to the fuel-cell power change rate when the fuel-cell power is smaller than the average vehicle power;

S02: selecting different fuel-cell power change rates, and calculating an SOC value of a corresponding lithium-ion battery, so as to obtain a set of SOC curves at different fuel-cell power change rates as well as an optimal fuel-cell power change rate with the lithium-ion battery having the smallest SOC fluctuation range;

S03: selecting a fixed fuel-cell power change rate within a range of the fuel-cell power change rate, and calculating the required average vehicle power within the time window; decreasing the fuel-cell power according to the fuel-cell power change rate when the fuel-cell power is greater than the average vehicle power, and increasing the fuel-cell power according to the fuel-cell power change rate when the fuel-cell power is smaller than the average vehicle power;

S04: selecting different time windows, and calculating the SOC value of the corresponding lithium-ion battery within the different time windows, so as to obtain a set of SOC curves within the different time windows as well as an optimal time window with the lithium-ion battery having the smallest SOC fluctuation range;

S05: obtaining the optimal fuel-cell power change rate and time window according to the collected actual vehicle power, and calculating the SOC fluctuation range of the lithium-ion battery; and S06: calculating the electric quantity (in kW·h) of the mounted lithium-ion battery according to the calculated SOC fluctuation range and an allowable SOC fluctuation range of the lithium-ion battery.

Preferably, in step S02, the selected fuel-cell power change rate is 0.05 KW/S-2 KW/S.

Preferably, in step S04, the selected time window ranges from 1 s to 10 min.

Preferably, in step S05, when the obtained optimal fuel-cell power change rate exceeds the range of the fuel-cell power change rate, the obtained optimal time window is selected as the fixed time window, within which the required average vehicle power is calculated; the fuel-cell power is decreased according to the power change rate when greater than the average vehicle power, and increased according to the fuel-cell power change rate when smaller than the average vehicle power; and the different fuel-cell power change rates are selected within the range of the fuel-cell power change rate, and the SOC value of the corresponding lithium-ion battery is calculated, so as to obtain a set of SOC curves at different fuel-cell power change rates as well as an optimal fuel-cell power change rate with the lithium-ion battery having the smallest SOC fluctuation range.

Preferably, in step S06, a formula for calculating the electric quantity (in kW·h) of the lithium-ion battery is $E_1 \times \Delta SOC_1 = E_2 \times \Delta SOC_2$, where $E_1$ is the electric quantity (in kW·h) of a mounted small-electric-quantity lithium-ion battery, $\Delta SOC_1$ is the SOC fluctuation range of the small-electric-quantity lithium-ion battery, $E_2$ is the electric quantity (in kW·h) of a mounted large-electric-quantity lithium-ion battery, and $\Delta SOC_2$ is the SOC fluctuation range of the large-electric-quantity lithium-ion battery.

The present invention has the following beneficial effects compared with the prior art:

The method of the present invention can be considered from the following two perspectives. First, from the perspective of price and resource allocation: with the proper power control strategy, the fuel-cell vehicle is equipped with the small-electric-quantity lithium-ion battery as far as possible within the SOC fluctuation range, so as to reflect the great price advantage and good resource allocation strategy; second, from the perspective of operating conditions of the fuel-cell vehicle and service life of the lithium-ion battery: if there is a demand for driving purely with the lithium-ion battery, the fuel-cell vehicle has to be equipped with the large-electric-quantity lithium-ion battery; during driving non-purely with the lithium-ion battery, if the electric quantity (in kW·h) of the lithium-ion battery is rationally selected, and the SOC fluctuation can be controlled within a small range through the power control strategy, the most suitable SOC range for the operation of the lithium-ion battery can be selected, which is conducive to prolonging the service life of the lithium-ion battery.

The power distribution strategy of the present invention can rationally allocate resources and extend the application range of the lithium-ion battery to the maximum extent.

BRIEF DESCRIPTION OF THE DRAWINGS

The present invention will be further described below with reference to drawings and examples.

DETAILED DESCRIPTION OF THE EMBODIMENTS

In order to make the objects, technical solutions and advantages of the present invention clearer, the present invention will be further described below in detail with reference to the specific embodiments and drawings. It is to be understood that the description is only exemplary, and not intended to limit the scope of the present invention. In addition, the depiction of well-known structures and technologies is omitted in the following description so as to avoid unnecessarily confusing the concepts of the present invention.

By the method for optimizing the power distribution of the fuel-cell vehicle of the present invention, a rational fuel-cell power following strategy is made according to values such as vehicle fuel-cell power, battery power, and SOC of a lithium-ion battery; in the same time window, effects of different fuel-cell power growth rates on SOC of the lithium-ion battery are tested according to vehicle requirements; and at the same fuel-cell growth rate, effects of different time windows on SOC of the lithium-ion battery are tested according to vehicle requirements; a proper time window and a proper fuel-cell power change rate are found, so that the SOC value of the lithium-ion battery fluctuates within a certain range. Object 1: when a large-electric-quantity lithium-ion battery is used, the SOC range of the lithium-ion battery can be adjusted to maintain an optimal small SOC fluctuation range, so as to prolong the service life of the lithium-ion battery. Object 2: on this basis, the demand for the large-electric-quantity lithium-ion batteries for the fuel-cell vehicles currently on the market can be reduced, and a suitable fuel-cell power growth rate and a suitable time window can realize the application of the small-electric-quantity lithium-ion batteries in the fuel-cell vehicles. so that the resources are rationally allocated.

Figure 1:
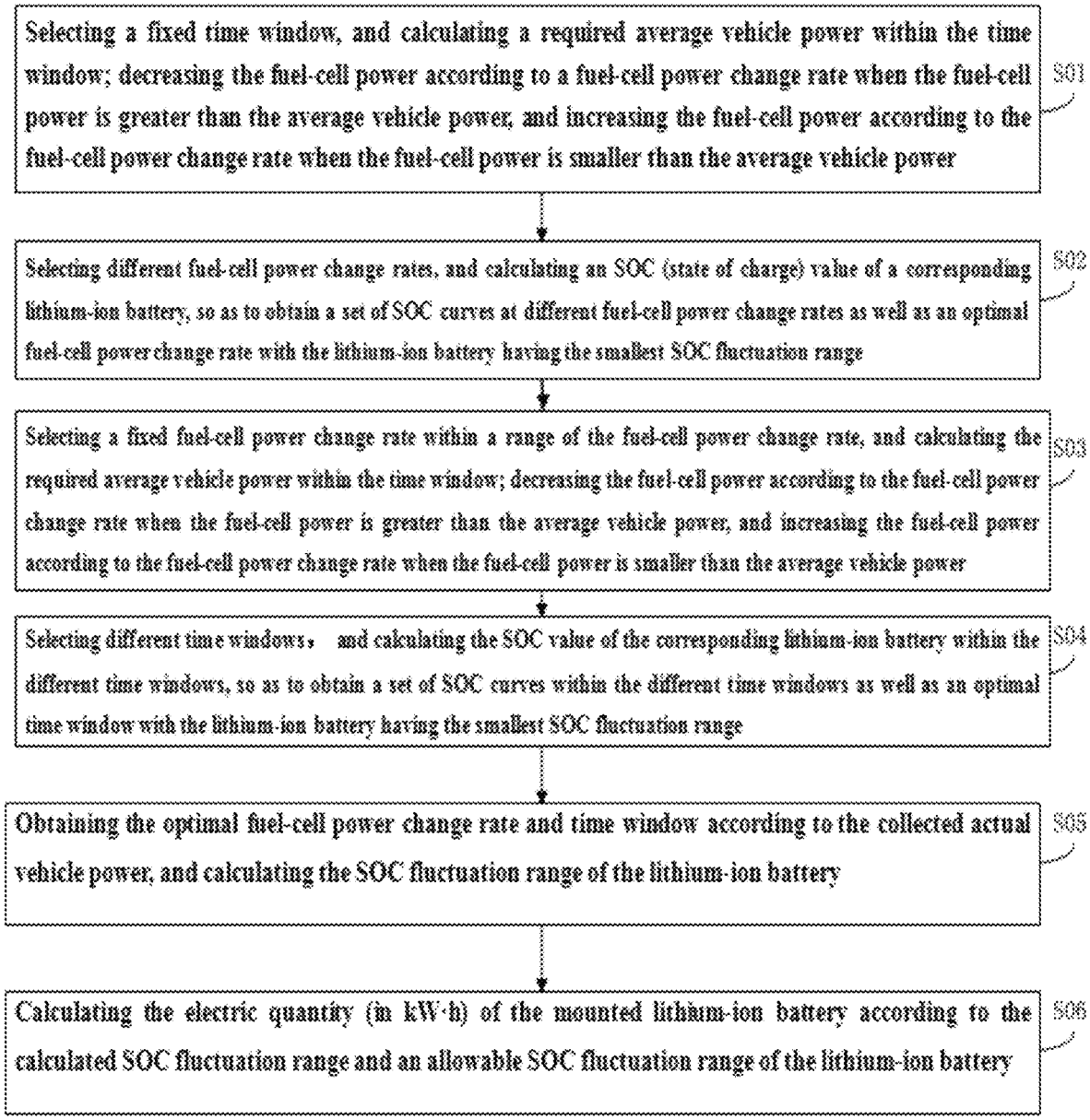
FIG. 1 is a flowchart of the method for optimizing the power distribution of a fuel-cell vehicle of the present invention.

As shown in FIG. 1, this method specifically comprises the following steps:

S01: selecting a fixed time window, and calculating a required average vehicle power within the time window; decreasing the fuel-cell power according to a fuel-cell power change rate when the fuel-cell power is greater than the average vehicle power, and increasing the fuel-cell power according to the fuel-cell power change rate when the fuel-cell power is smaller than the average vehicle power;

S02: selecting different fuel-cell power change rates (preferably 0.05 KW/S-2 KW/S), and calculating the SOC value of the corresponding lithium-ion battery, so as to obtain a set of SOC curves at different fuel-cell power change rates as well as an optimal fuel-cell power change rate with the lithium-ion battery having the smallest SOC fluctuation range;

S03: selecting a fixed fuel-cell power change rate within a range of the fuel-cell power change rate, and calculating the required average vehicle power within the time window; decreasing the fuel-cell power according to the fuel-cell power change rate when the fuel-cell power is greater than the average vehicle power, and increasing the fuel-cell power according to the fuel-cell power change rate when the fuel-cell power is smaller than the average vehicle power;

S04: selecting different time windows (preferably 1 s to 10 min), and calculating the SOC value of the corresponding lithium-ion battery within the different time windows, so as to obtain a set of SOC curves within the different time windows as well as an optimal time window with the lithium-ion battery having the smallest SOC fluctuation range;

S05: obtaining the optimal fuel-cell power change rate and time window according to the collected actual vehicle power, and calculating the SOC fluctuation range of the lithium-ion battery; and S06: calculating the electric quantity (in kW·h) of the mounted lithium-ion battery according to the calculated SOC fluctuation range and an allowable SOC fluctuation range of the lithium-ion battery; the formula for calculating the electric quantity (in kW·h) of the lithium-ion battery is $E_1 \times SOC_1 = E_2 \times \Delta SOC_2$, where $E_1$ is the electric quantity (in kW·h) of a mounted small-electric-quantity lithium-ion battery, $\Delta SOC_1$ is the SOC fluctuation range of the small-electric-quantity lithium-ion battery, $E_2$ is the electric quantity (in kW·h) of a mounted large-electric-quantity lithium-ion battery, and $\Delta SOC_2$ is the SOC fluctuation range of the large-electric-quantity lithium-ion battery.

In step S05, when the obtained optimal fuel-cell power change rate exceeds the range of the fuel-cell power change rate, the obtained optimal time window is selected as the fixed time window, within which the required average vehicle power is calculated; the fuel-cell power is decreased according to the power change rate when greater than the average vehicle power, and increased according to the fuel-cell power change rate when smaller than the average vehicle power; and selecting the different fuel-cell power change rates within the range of the fuel-cell power change rate, and calculating the SOC value of the corresponding lithium-ion battery, so as to obtain a set of SOC curves at different fuel-cell power change rates as well as an optimal fuel-cell power change rate with the lithium-ion battery having the smallest SOC fluctuation range.

Figure 2:
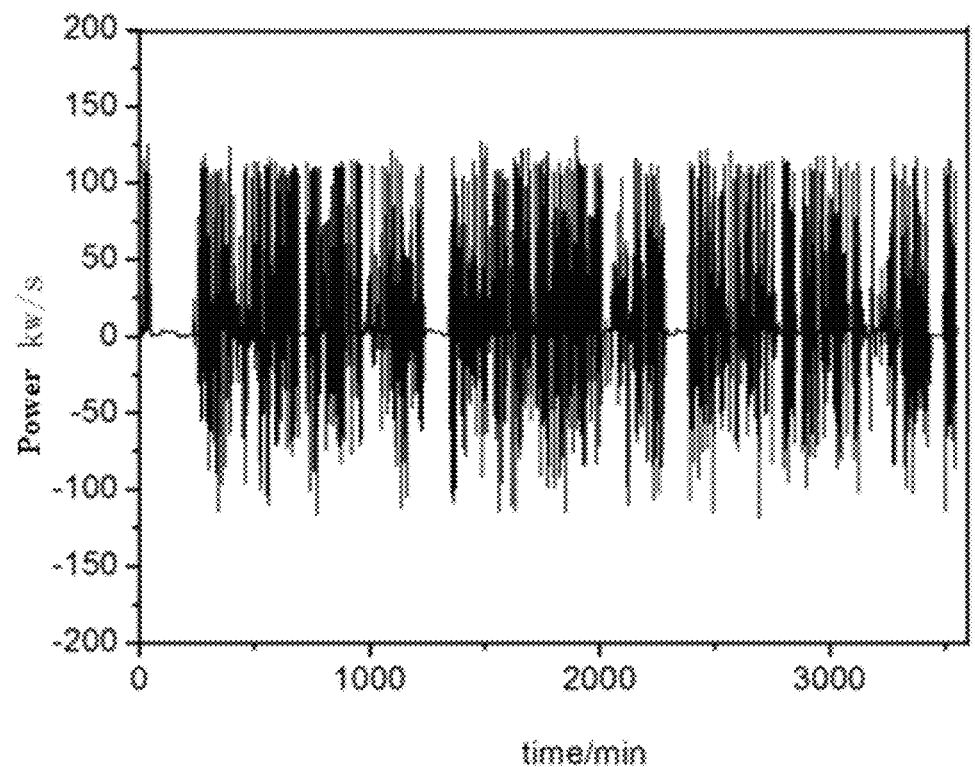
FIG. 2 is a diagram of the vehicle power.
Figure 3:
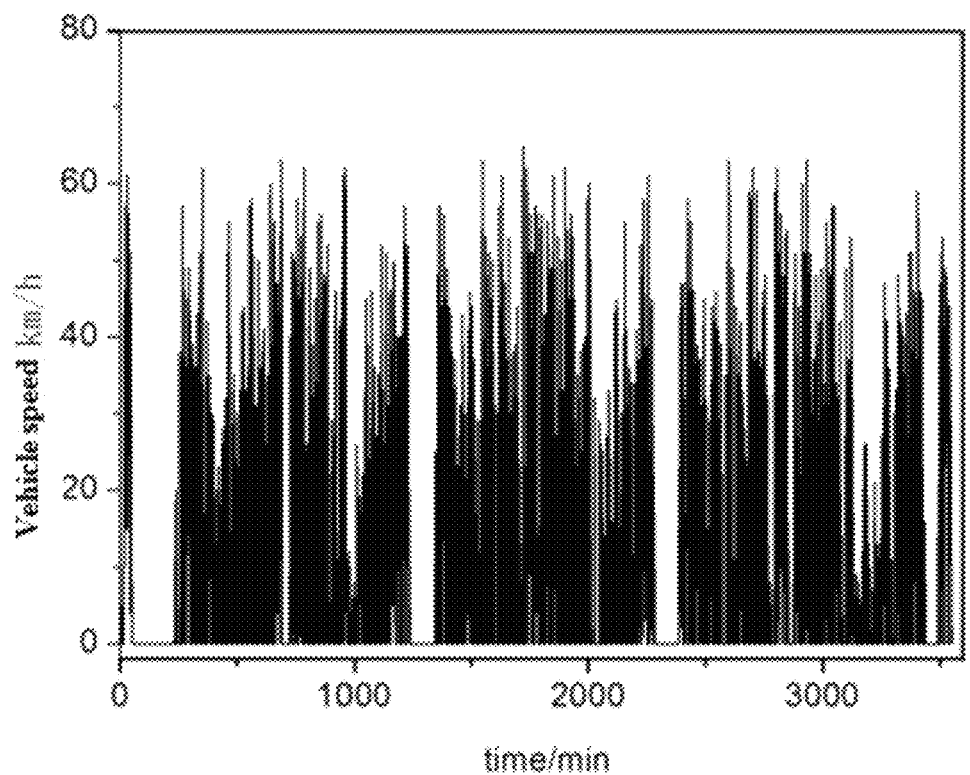
FIG. 3 is a diagram of the vehicle speed.
Figure 4:
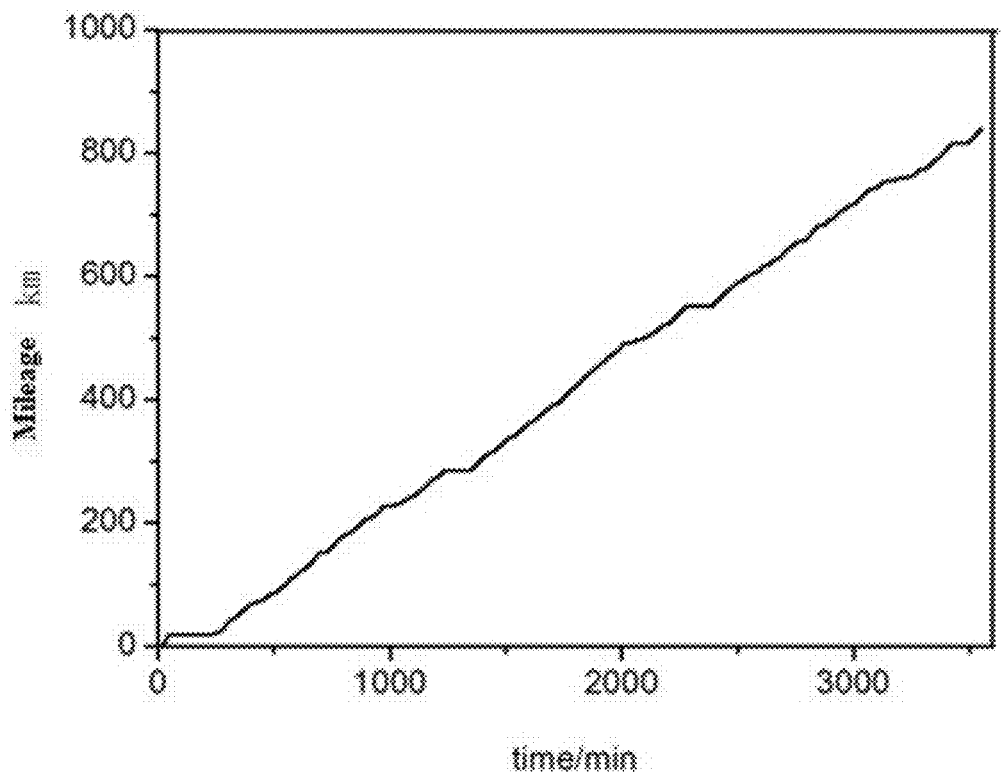
FIG. 4 is a diagram of the vehicle mileage.

The following will be described in combination with specific examples:

The power is controlled and adjusted based on the actual vehicle data, and the algorithm analysis results are tested. Vehicle length: 8 m; driving area: Jiangsu Province; and operating conditions: public transportation. The operating conditions such as the required power, speed and mileage of the vehicle are shown in FIGS. 2, 3 and 4 below.

Figure 5:
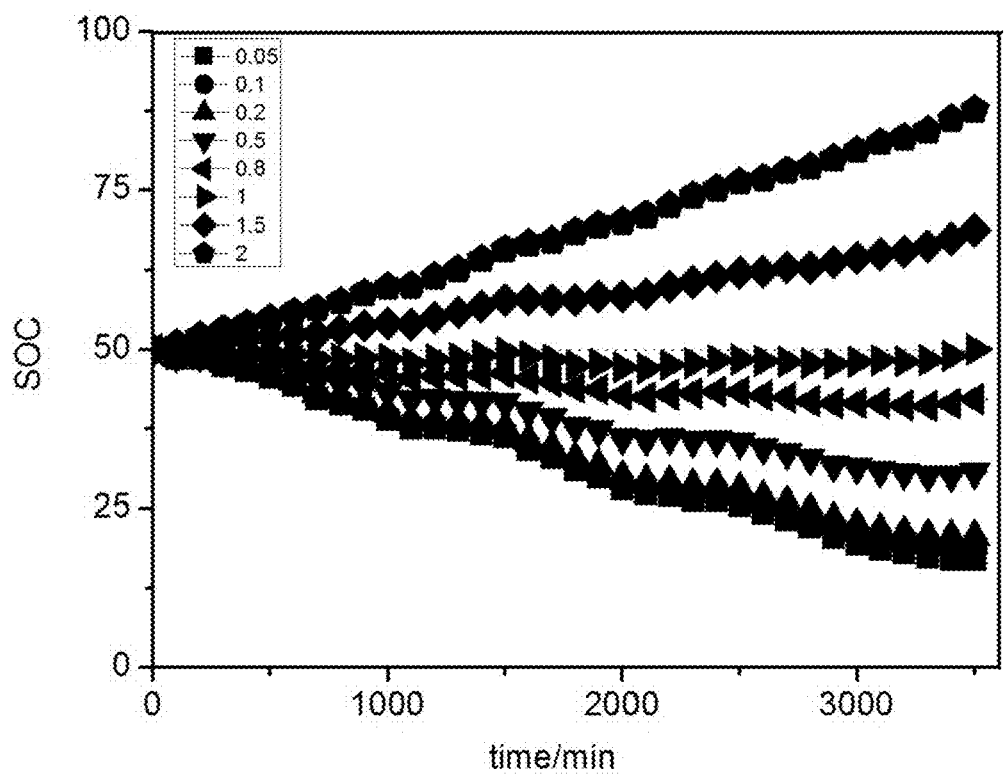
FIG. 5 is the SOC curve corresponding to different power change rates when the time window is 10 s.
Figure 6:
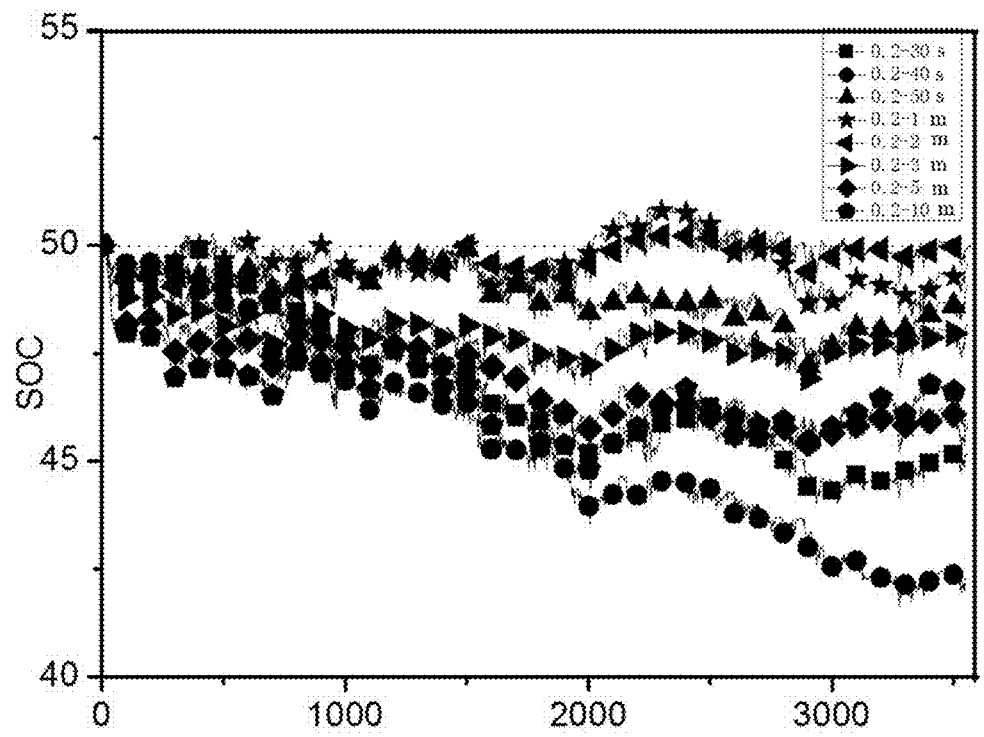
FIG. 6 is the SOC curve corresponding to different time windows when the power change rate is 0.2 KW/S.
Figure 7:
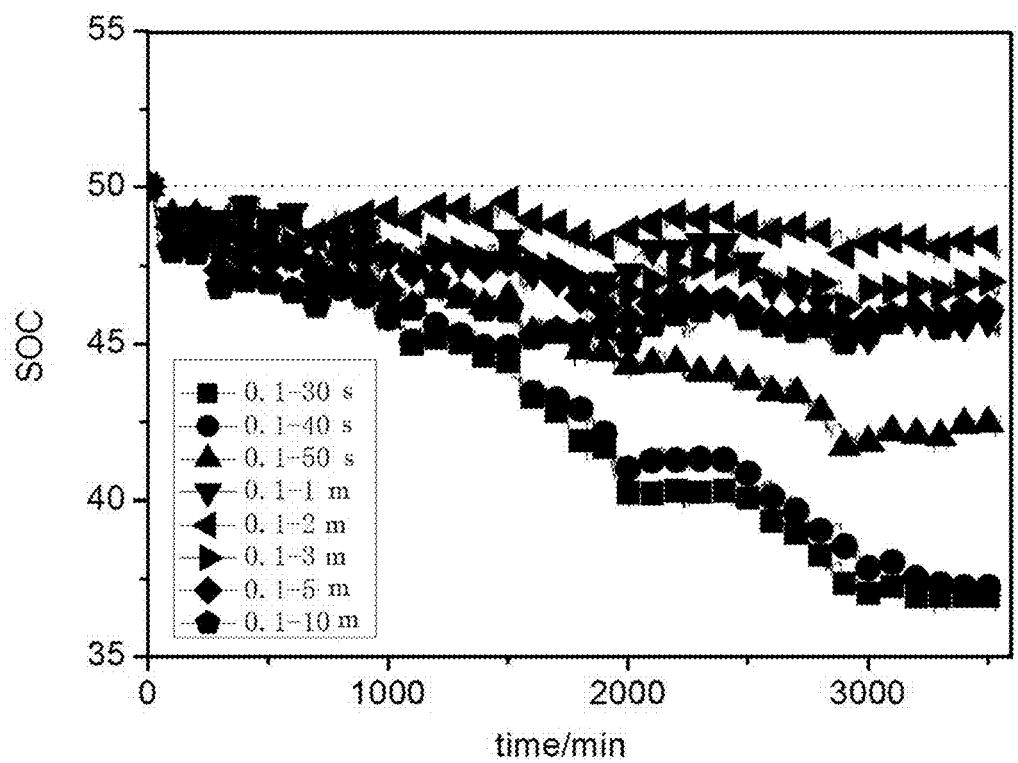
FIG. 7 is the SOC curve corresponding to different time windows when the power change rate is 0.1 KW/S.
Figure 8:
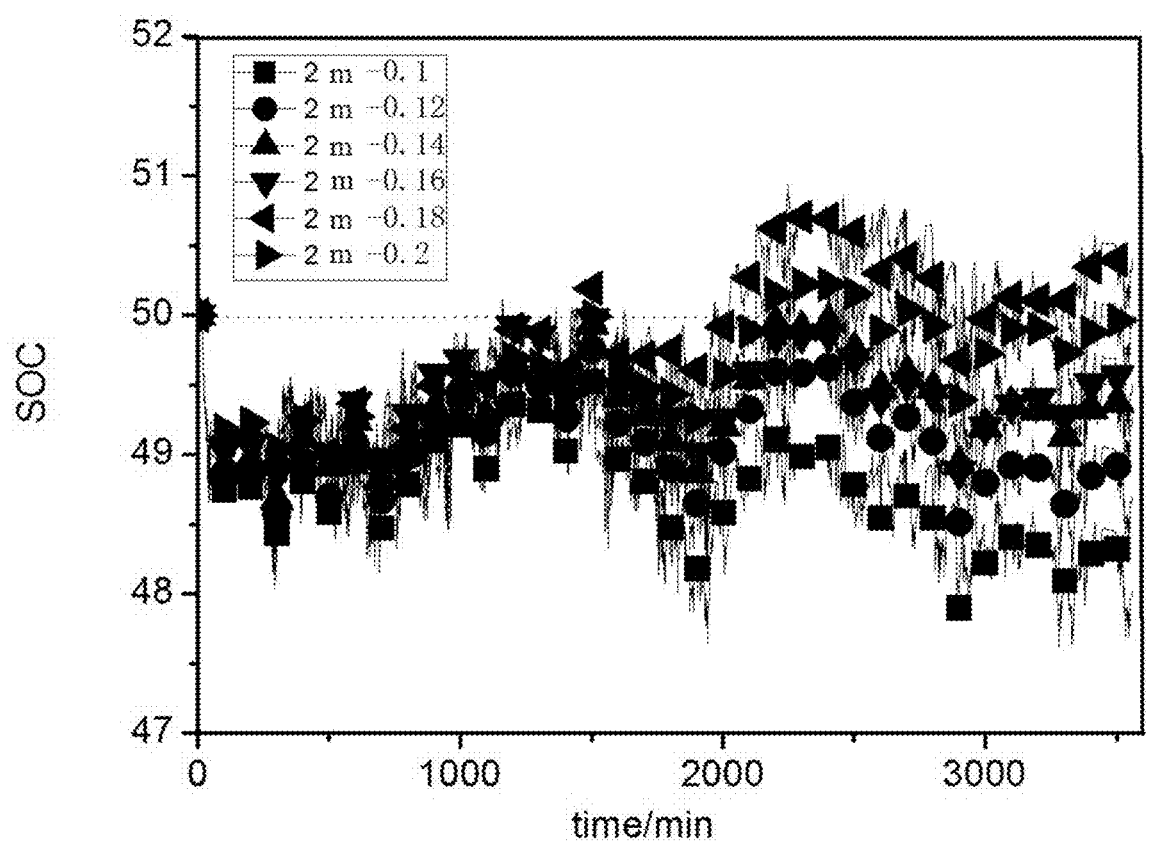
FIG. 8 is the SOC curve corresponding to different power change rates when the time window is 2 min.

Step 1: selecting a fixed time window of 10 s, and selecting the algorithm strategy as follows: decreasing the fuel-cell power according to a fuel-cell power change rate when the fuel-cell power is greater than the vehicle power, and increasing the fuel-cell power according to the fuel-cell power change rate when the fuel-cell power is smaller than the vehicle power;

step 2: selecting the different fuel-cell power change rates ($V_W$), specifically $V_{W1}$=0.05 kW/s, $V_{W2}$=0.1 kW/s, $V_{W3}$=0.2 kW/s, $V_{W4}$=0.5 kW/s, $V_{W5}$=0.8 kW/s, $V_{W6}$=1 kW/s, $V_{W7}$=1.5 kW/s and $V_{W8}$=2 kW/s, and calculating the SOC value of the corresponding lithium-ion battery, thus obtaining a set of SOC curves at different fuel-cell power change rates, as shown in FIG. 5; as can be seen from FIG. 5, the lithium-ion battery has the smallest SOC fluctuation range when the fuel-cell power change rate is KW/S;

step 3: limited by the technology and service life of the fuel cells, the current fuel-cell power change rate in the domestic market cannot reach 1 KW/S, with the current maximum value in practical applications being 0.2 KW/S; therefore, the strategy shall be changed to reduce the power change rate and the limit thereof to adapt to the existing characteristics of the fuel cells, with the limit controlled to be less than or equal to 0.2 KW/S; the fixed fuel-cell power change rate is selected to be 0.2 KW/S and 0.1 KW/S, and the required average vehicle power is calculated within the time window; the fuel-cell power is decreased according to the power change rate when greater than the average vehicle power, and increased according to the fuel-cell power change rate when smaller than the average vehicle power;

step 4: selecting different time windows, specifically $T_1$=30 s, $T_2$=40 s, $T_3$=50 s, $T_4$=1 min, $T_5$=2 min, $T_6$=3 min, $T_7$=5 min and $T_8$=10 min, and calculating the SOC value of the corresponding lithium-ion battery within the different time windows, thus obtaining a set of SOC curves, as shown in FIG. 6 where the fuel-cell power change rate is 0.2 KW/S and FIG. 7 where the fuel-cell power change rate is 0.1 KW/S; as can be seen from FIGS. 6 and 7, the lithium-ion battery has the smallest SOC fluctuation range when the time window is 2 min;

step 5: according to the analysis of the actual vehicle operating conditions, the time window of 2 min allows the lithium-ion battery to have the advantage of a smaller SOC fluctuation range; with the time window set to 2 min, the different fuel-cell power change rates are selected, specifically $V_{W1}$=0.1 kW/s, $V_{W2}$=0.12 kW/s, $V_{W3}$=0.14 kW/s, $V_{W4}$=0.16 kW/s, $V_{W5}$=0.18 kW/s and $V_{W6}$=0.2 kW/s, thus obtaining a set of SOC curves at different fuel-cell power change rates, as shown in FIG. 8; as can be seen from FIG. 8, when the time window is set to 2 min, the fuel-cell power change rate is 0.1-0.2 kW/s, and the SOC fluctuation range of the lithium-ion battery is small (optimal when the fuel-cell power change rate is 0.2 kW/s); and step 6: the electric quantity (in kW·h) of the mounted lithium-ion battery is calculated according to the calculated SOC fluctuation range and an allowable SOC fluctuation range of the lithium-ion battery; the formula for calculating the electric quantity (in kW·h) of the lithium-ion battery is $E_1 \times \Delta SOC_1 = E_2 \times \Delta SOC_2$, where $E_1$ is the electric quantity (in kW·h) of a mounted small-electric-quantity lithium-ion battery, $\Delta SOC_1$ is the SOC fluctuation range of the small-electric-quantity lithium-ion battery, $E_2$ is the electric quantity (in kW·h) of a mounted large-electric-quantity lithium-ion battery, and $\Delta SOC_2$ is the SOC fluctuation range of the large-electric-quantity lithium-ion battery;

if the fuel-cell vehicle is equipped with the large-electric-quantity lithium-ion battery, the SOC fluctuation range will be small, such that the service life of the lithium-ion battery can be prolonged by selecting a suitable voltage range for the lithium-ion battery; if the fuel-cell vehicle is equipped with the small-electric-quantity lithium-ion battery, the SOC fluctuation range will be large, but the fuel-cell vehicle can save costs, rationally allocate resources and extend the application range of the lithium-ion battery to the maximum extent.

The above embodiments of the present invention are merely used to illustratively describe or explain the principles of the present invention, and do not constitute a limitation of the present invention. Therefore, any modifications, equivalent substitutions, improvements, etc., which are made without departing from the spirit and scope of the present invention, are intended to be included within the scope of the present invention. Besides, the claims of the present invention are intended to cover all the changes and modifications falling within the scope and boundary, or equivalents thereof, of the claims.

The invention claimed is:

1. A method for optimizing power distribution of a fuel-cell vehicle, characterized in that: the method comprises the following steps:
   S01: selecting a fixed time window, and calculating a required average vehicle power within the time window; decreasing the fuel-cell power according to a fuel-cell power change rate when the fuel-cell power is greater than the average vehicle power, and increasing the fuel-cell power according to the fuel-cell power change rate when the fuel-cell power is smaller than the average vehicle power;
   S02: selecting different fuel-cell power change rates, and calculating an SOC (state of charge) value of a corresponding lithium-ion battery, so as to obtain a set of SOC curves at different fuel-cell power change rates as well as an optimal fuel-cell power change rate with the lithium-ion battery having the smallest SOC fluctuation range;

S03: selecting a fixed fuel-cell power change rate within a range of the fuel-cell power change rate, and calculating the required average vehicle power within the time window; decreasing the fuel-cell power according to the fuel-cell power change rate when the fuel-cell power is greater than the average vehicle power, and increasing the fuel-cell power according to the fuel-cell power change rate when the fuel-cell power is smaller than the average vehicle power;

S04: selecting different time windows, and calculating the SOC value of the corresponding lithium-ion battery within the different time windows, so as to obtain a set of SOC curves within the different time windows as well as an optimal time window with the lithium-ion battery having the smallest SOC fluctuation range;

S05: obtaining the optimal fuel-cell power change rate and time window according to a collected actual vehicle power, and calculating the SOC fluctuation range of the lithium-ion battery; and S06: calculating the electric quantity (in kW·h) of a mounted lithium-ion battery according to the calculated SOC fluctuation range and an allowable SOC fluctuation range of the lithium-ion battery.

2. The method for optimizing power distribution of a fuel-cell vehicle according to claim 1, characterized in that: in step S02, the selected fuel-cell power change rate is 0.05 KW/S-2 KW/S.

3. The method for optimizing power distribution of a fuel-cell vehicle according to claim 1, characterized in that: in step S04, the selected time window ranges from 1 s to 10 min.

4. The method for optimizing power distribution of a fuel-cell vehicle according to claim 1, characterized in that: in step S05, when the obtained optimal fuel-cell power change rate exceeds the range of the fuel-cell power change rate, the obtained optimal time window is selected as the fixed time window, within which the required average vehicle power is calculated; the fuel-cell power is decreased according to the fuel-cell power change rate when greater than the average vehicle power, and increased according to the fuel-cell power change rate when smaller than the average vehicle power; and the different fuel-cell power change rates are selected within the range of the fuel-cell power change rate, and the SOC value of the corresponding lithium-ion battery is calculated, so as to obtain a set of SOC curves at different fuel-cell power change rates as well as an optimal fuel-cell power change rate with the lithium-ion battery having the smallest SOC fluctuation range.

5. The method for optimizing power distribution of a fuel-cell vehicle according to claim 1, characterized in that: in step S06, a formula for calculating the electric quantity (in kW·h) of the lithium-ion battery is $E_1 \times \Delta SOC_1 = E_2 \times \Delta SOC_2$, where $E_1$ is the electric quantity (in kW·h) of a mounted first-electric-quantity lithium-ion battery, $\Delta SOC_1$ is the SOC fluctuation range of the first-electric-quantity lithium-ion battery, $E_2$ is the electric quantity (in kW·h) of a mounted second-electric-quantity lithium-ion battery, and $\Delta SOC_2$ is the SOC fluctuation range of the second-electric-quantity lithium-ion battery.

* * * * *